(12) United States Patent
Takahashi

(10) Patent No.: US 6,700,412 B2
(45) Date of Patent: Mar. 2, 2004

(54) SEMICONDUCTOR DEVICE

(75) Inventor: Hiroyuki Takahashi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 17 days.

(21) Appl. No.: 09/978,722

(22) Filed: Oct. 18, 2001

(65) Prior Publication Data

US 2002/0047166 A1 Apr. 25, 2002

(30) Foreign Application Priority Data

Oct. 19, 2000 (JP) ........................................ 2000-319978

(51) Int. Cl.[7] ............................................... H03K 19/20
(52) U.S. Cl. ........................ 326/119; 326/112; 326/121
(58) Field of Search ................................ 326/101–104, 326/112, 119, 121

(56) References Cited

U.S. PATENT DOCUMENTS 5,703,499 A  * 12/1997 Abe et al. ..................... 326/62

FOREIGN PATENT DOCUMENTS

JP         62-286265         12/1987

OTHER PUBLICATIONS

Korean Office Action dated Jun. 28, 2003 with Japanese and partial English translations.
Sedra, et al., "Microelectronic Circuits", Third Edition, 1989, pp. 1061–1063.

* cited by examiner

*Primary Examiner*—Anh Tran
(74) *Attorney, Agent, or Firm*—McGinn & Gibb, PLLC

(57) ABSTRACT

The invention provides a semiconductor device which can efficiently suppress current consumption arising from a band to band tunneling phenomenon without causing a drop of the operation speed of the circuit. A NAND circuit includes, as a MOS transistor which is controlled to an off state while a predetermined potential difference is provided between the gate and the drain thereof, an n-type MOS transistor which has a band to band leak preventing countermeasure applied to the drain thereof. Consequently, even if an input signal to the MOS transistor exhibits the L level in the standby mode and the n-type MOS transistor is placed in a state wherein band to band leak can occur, occurrence of band to band leak is suppressed in the n-type MOS transistor.

45 Claims, 11 Drawing Sheets

SEMICONDUCTOR DEVICE

BACKGROUND OF THE INVENTION

1. Field of the Invention

The present invention relates to a semiconductor device including a MOS transistor, and more particularly to a technique for suppressing current consumption arising from band to band leak.

2. Description of the Related Art

In recent years, in the field of semiconductors, the thickness of the gate oxide film which forms a MOS transistor has reduced significantly in accordance with advancement of the refinement of the device structure. As the thickness of the gate oxide film of a MOS transistor decreases, the electric field around the drain becomes stronger, and the bend of a band on the surface of the substrate becomes greater than the band gap of silicon. As a result, a band to band tunneling phenomenon appears in an overlapping area of the gate and the drain.

If the band to band tunneling phenomenon appears, then leak current occurs between the drain and the substrate. Therefore, where the circumstances do not permit leak current arising from the band to band tunneling, a countermeasure for suppressing the band to band tunneling phenomenon is taken for the MOS transistor. Generally, as the countermeasure, the impurity concentration in the drain region in the proximity of the surface of the substrate is suppressed to moderate the intensity of the electric field.

However, even if the band to band tunneling phenomenon appears, this does not make an obstacle to functioning operation of the circuit unless holes generated then are caught by the gate oxide film and cause deterioration of a device characteristic such as the gate threshold voltage Vth. Accordingly, where only it is required that the functioning operation is guaranteed, it is not always necessary to take a countermeasure for suppressing the band to band tunneling phenomenon.

However, a semiconductor device which has a standby mode for suppressing current consumption as an operation mode has a problem in that increase of the current consumption in the standby mode arising from appearance of the band to band tunneling phenomenon gives rise to such a situation that standards for current consumption cannot be satisfied.

Also it is a problem that, if a countermeasure for suppressing the band to band tunneling phenomenon is taken, then this decreases the current driving capacity of the MOS transistor and consequently decreases the operation speed of the circuit.

SUMMARY OF THE INVENTION

It is an object of the present invention to provide a semiconductor device which can efficiently suppress current consumption arising from a band to band tunneling phenomenon without causing a drop of the operation speed of a circuit.

In order to attain the object described above, according to an aspect of the present invention, there is provided a semiconductor device, comprising a circuit including a plurality of MOS transistors, the MOS transistors including a MOS transistor which is controlled to an off state while a predetermined potential difference is provided between a gate and a drain thereof, the MOS transistor having a band to band leak preventing countermeasure applied to the drain thereof.

With the semiconductor device, since it comprises the MOS transistor which is controlled to an off state while a predetermined potential difference is provided between a gate and a drain thereof and has a band to band leak preventing countermeasure applied to the drain thereof, current consumption arising from a band to band tunneling phenomenon can be suppressed efficiently while suppressing the drop of the operation speed of the circuit to the minimum.

According to another aspect of the present invention, there is provided a semiconductor device, comprising a plurality of circuits each including a plurality of MOS transistors, the MOS transistors including a MOS transistor which is controlled to an off state while a predetermined potential difference is provided between a gate and a drain thereof, the MOS transistor having a band to band leak preventing countermeasure applied to the drain thereof except any of the circuits for which a high operation speed is required.

With the semiconductor device, since it comprises the MOS transistor which is controlled to an off state while a predetermined potential difference is provided between a gate and a drain thereof and has a band to band leak preventing countermeasure applied to the drain thereof except any of the circuits for which a high operation speed is required, current consumption arising from a band to band tunneling phenomenon can be suppressed efficiently without sacrificing the operation speed of the circuit at all.

According to a further aspect of the present invention, there is provided a semiconductor device, comprising a circuit including a plurality of MOS transistors, the MOS transistors including a MOS transistor having a drain to which a logic level with which band to band leak can occur in a dynamic operation state is applied, the MOS transistor having a gate to which a logic level same as the logic level is applied in a static operation state.

With the semiconductor device, since it comprises the MOS transistor having a drain to which a logic level with which band to band leak can occur in a dynamic operation state is applied and has a gate to which a logic level same as the logic level is applied in a static operation state, current consumption arising from a band to band tunneling phenomenon can be suppressed efficiently without applying any countermeasure on a device and without giving rise to a drop of the operation speed of the circuit at all.

In all of the semiconductor devices above, the MOS transistor may be an n-type MOS transistor which is a component of a basic gate circuit for logical NANDing operation, and the drain thereof may be connected to an output node of the basic gate circuit.

As an alternative, the MOS transistor may be a p-type MOS transistor which is a component of a basic gate circuit for logical NORing operation, and the drain thereof may be connected to an output node of the basic gate circuit, The MOS transistor may be a component of a basic gate circuit for logical NOT operation.

Alternatively, the MOS transistor may be a component of a static memory cell which includes a flip-flop as a principal component.

Further alternatively, the MOS transistor may be a component of a column switch for selecting a bit line pair.

The MOS transistor may drive a bit line pair in a write mode.

Otherwise, the MOS transistor may be a component of a sense amplifier which includes a flip-flop as a principal component.

Or else, the MOS transistor may be a component of a bus holder for holding the level of a data bus which is drive, for example, by a tri-state buffer.

The MOS transistor may drive a pair of data buses for transmitting a data signal composed of complementary signals in a read mode.

Further, the MOS transistor may be a component of a flip-flop.

Alternatively, the MOS transistor may be a component of a logic circuit which receives input signals at the source and the gate of the MOS transistor and performs predetermined logical operation of the input signals.

The MOS transistor may be connected at the drain thereof to a power supply or the ground.

Furthermore, the MOS transistor may be a component of a level conversion circuit for converting the signal level of an input signal.

Alternatively, the MOS transistor may be a component of a pulse generation circuit for detecting a variation of an input signal to generate a one-shot pulse.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENTS

In the following, several embodiments of the present invention are described with reference to the accompanying drawings.

<First Embodiment>

Figure 1:
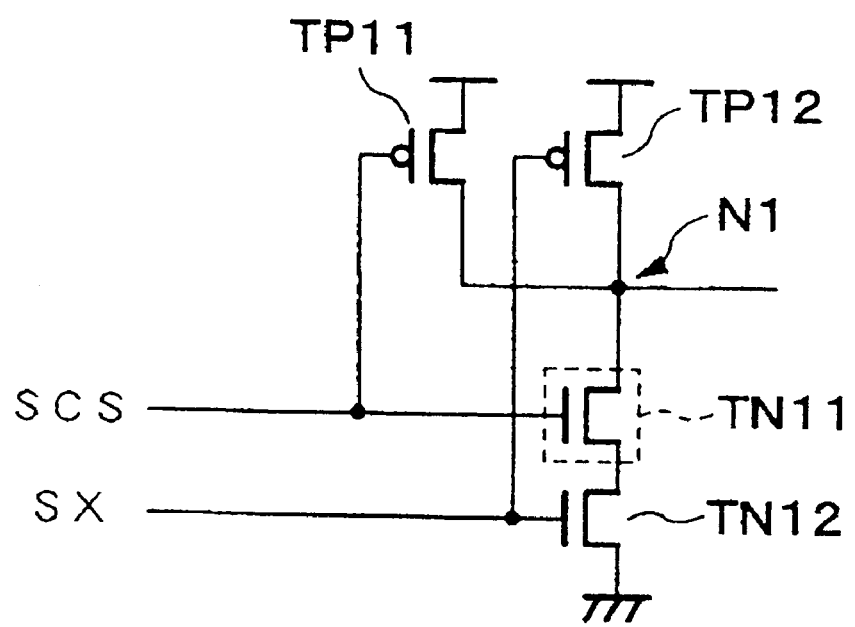
FIG. 1 is a circuit diagram showing a configuration of a basic gate of a semiconductor device according to a first embodiment of the present invention.

A characteristic portion of a semiconductor device according to a first embodiment of the present invention is shown in FIG. 1.

The semiconductor device is a semiconductor memory having a standby mode for suppressing power consumption such as, for example, an SRAM (Static Random Access Memory) or an artificial SRAM and includes a MOS transistor as an active element. The semiconductor device further includes a MOS transistor which exhibits an off state wherein a predetermined potential difference appears between the gate and the drain when the semiconductor device is in the standby mode. The MOS transistor has a band to band leak current countermeasure (a countermeasure for suppressing a band to band tunneling phenomenon) applied to the drain side thereof.

First, a circuit configuration shown in FIG. 1 is described.

The circuit shown is a basic gate circuit (hereinafter referred to as [NAND gate]) for logical NANDing operation. The circuit includes a pair of p-type NOS transistors TP11 and TP12 having current paths connected in parallel between an output node N1 and the power supply, and a pair of n-type MOS transistors TN11 and TN12 having current paths connected in series between the output node N1 and the ground. A signal SCS which exhibits the L level in the standby mode is applied to the gates of the p-type MOS transistor TP11 and the n-type MOS transistor TN11. A signal SX outputted from a circuit in the preceding stage not shown is applied to the p-type MOS transistor TP12 and the n-type MOS transistor TN12. The drain of the n-type MOS transistor TN11 is connected to the output node N1 and has a band to band leak preventing countermeasure applied thereto.

Operation of the NAND gate is described.

First, operation of the NAND gate in the standby mode is described. In the standby mode, the signal SCS has the L level (ground potential), and the p-type MOS transistor TP11 which receives the signal SCS at the gate thereof exhibits an on state and the n-type MOS transistor TN11 exhibits an off state. Accordingly, without depending upon the logical level of the signal SX, the output node N1 is electrically disconnected from the ground by the n-type MOS transistor TN11 and is electrically connected to the power supply through the p-type OS transistor TP11, Consequently, the H level (power supply electric potential) appears at the output node N1.

At this time, the n-type OS transistor TN11 exhibits an off state while a predetermined potential difference appears between the gate and the drain. Further, the n-type MOS transistor TN11 is placed in a biased state in which leak current (band to band leak current) arising from a band to band tunneling phenomenon can appear between the drain of the transistor TN11 and the substrate. However, since a band to band leak preventing countermeasure is applied to the drain of the n-type MOS transistor TN11, band to band leak current does not appear with the n-type MOS transistor TN11. Further, the drain of the n-type MOS transistor TN12 is in a floating state and the H level appearing at the output node N1 is not applied to the drain. Consequently, band to band leak current does not appear with the n-type MOS transistor TN12 either.

Meanwhile, since the H level appears at the drains of the p-type MOS transistors TP11 and TP12, the transistors TP11 and TP12 are not in a biased state wherein leak current (band to band leak current) arising from a band to band tunneling phenomenon can appear.

After all, among the MOS transistors which form the NAND gate, only the n-type MOS transistor TN11 is a transistor wherein band to band leak current can appear in the standby mode. As a result, it is sufficient if a band to band leak preventing countermeasure is applied to the n-type MOS transistor TN11. Accordingly, the number of MOS transistors to which a band to band leak preventing counter measure is applied can be suppressed to the necessary minimum number and the drop of the operation speed of the NAND gate is suppressed to the minimum.

Operation of the NAND gate in a write mode and a read mode is described. In the operation modes, the signal SCS has the H level, and the p-type MOS transistor TP11 which receives the signal SCS at the gate thereof exhibits an off state and the n-type MOS transistor TN11 which receives the signal SCS at the gate thereof exhibits an on state. Accordingly, the H level or the L level appears on the output node N1 in response to the logical level of the signal SX. At this time, if notice is taken of the n-type MOS field effect transistor TN11, it can be recognized that, since the potential at the gate does not become lower than the potential at the drain in any case, the n-type MOS transistor TN11 is not in a biased state in which band to band leak can occur.

Further, if notice is taken of the n-type MOS field effect transistor TN12, it can be recognized that, since the potential at the output node N1 is applied to the drain of the transistor TN12 after it drops by an amount corresponding to the gate threshold voltage of the n-type MOS field effect transistor TN11, even if the L level is applied to the gate of the n-type MOS electric field effect transistor TN12, the potential difference between the gate and the drain is moderated. Therefore, in the n-type MOS field effect transistor TN12, occurrence of band to band leak is suppressed. Further, if the H level is applied to the gate of the n-type MOS field effect transistor TN12, then the potential relationship between the gate and the drain is improved still more, and occurrence of band to band leak is suppressed still more.

In the following, several working examples are described.
First Working Example

Figure 2:
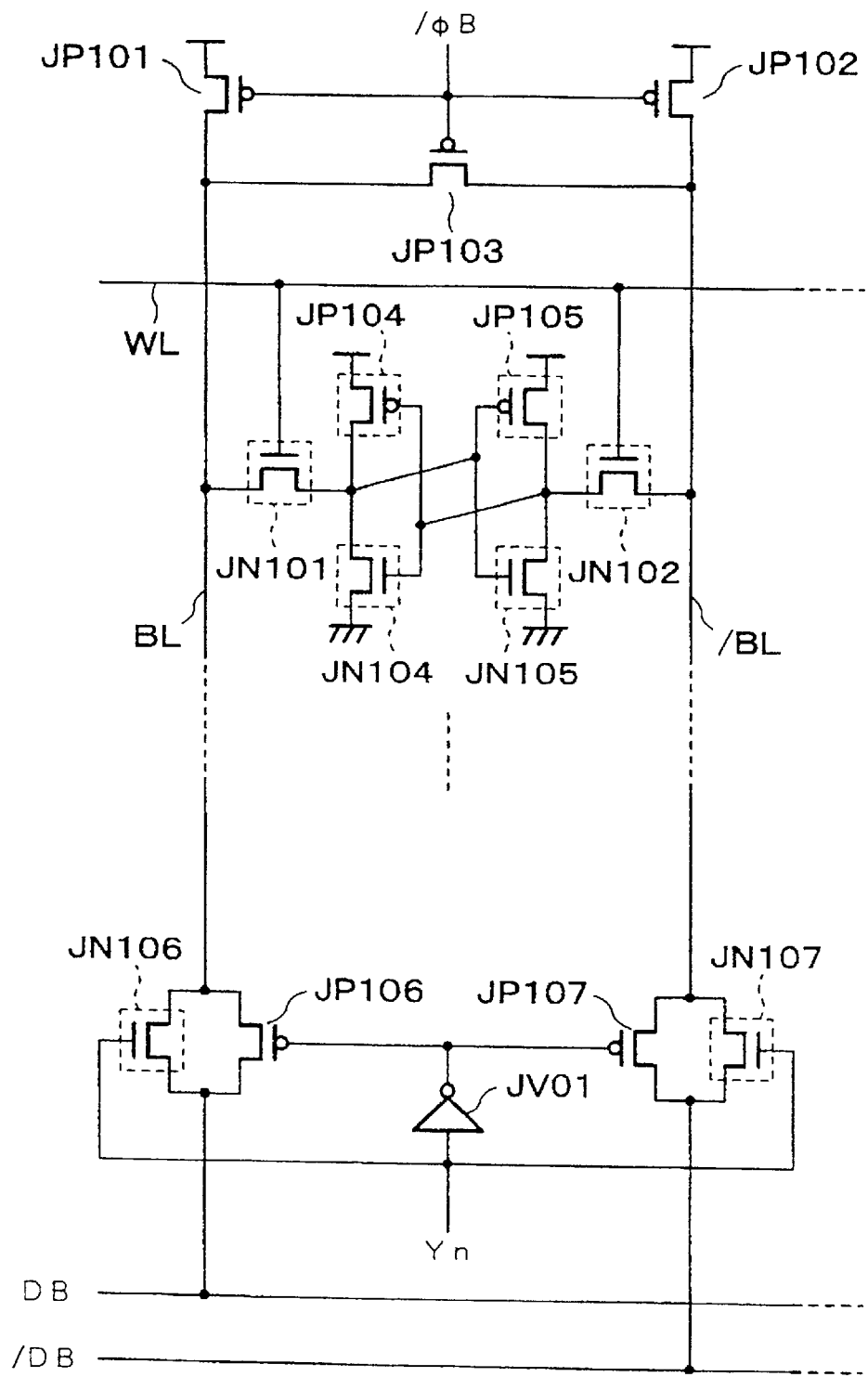
FIG. 2 is a circuit diagram showing a circuit system of a memory cell of a static RAM according to a first working example of the first embodiment of the present invention.
Figure 3:
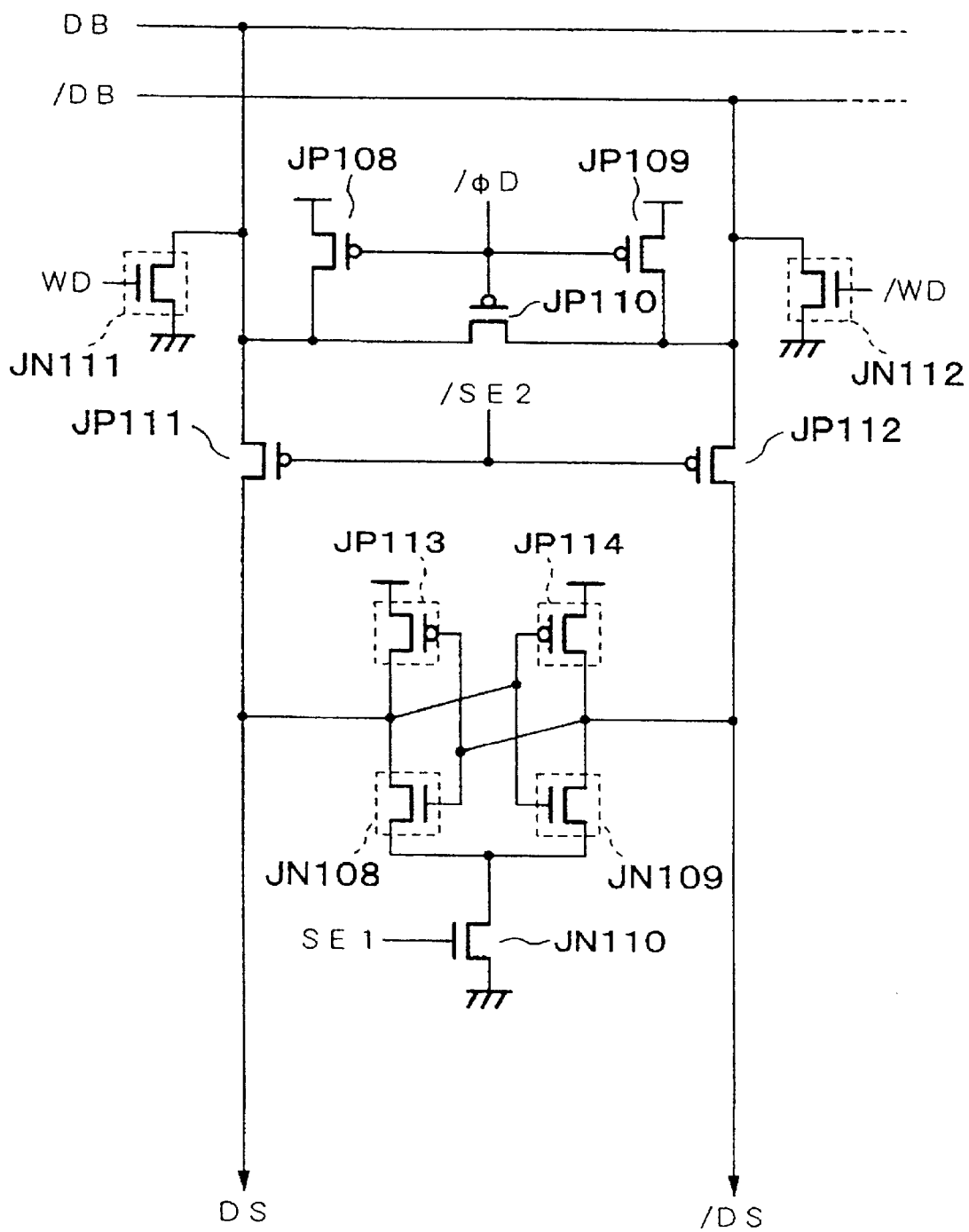
FIG. 3 is a circuit diagram showing a circuit system of a data amplifier of the static RAM according to the first working example.

An example of a configuration of a circuit system from a memory cell to a data amplifier in a static RAM is shown in FIGS. 2 and 3.

Referring first to FIG. 2, a pair of p-type MOS transistors JP104 and JP105 and four n-type MOS transistors JN101, JN112, JN104 and JN105 form a static memory cell. In particular, the memory cell includes a flip-flop as a principal component, and the p-type MOS transistors JP104 and JP105 and the n-type MOS transistors JN104 and JN105 form the flip-flop. The n-type MOS transistors JN101 and JN102 for transmitting data are connected between a pair of internal nodes of the flip-flop and a pair of bit lines BL and /BL, respectively. The gates of the n-type MOS transistors JN101 and JN102 are connected to a word line WL.

The drains of the p-type MOS transistors JP104 and JP105 and the n-type MOS transistors JN104 and JN105 which form the memory cell and the electrodes on one end side of current paths of the n-type MOS transistors JN101 and JN102 which are connected to the internal nodes of the memory cell have a band to band leak preventing countermeasure applied thereto. A plurality of such memory cells configured in this manner are arranged in a matrix to form a memory cell array, and a plurality of bit line pairs and a plurality of word lines are arranged perpendicularly along the rows and columns of the memory cell array.

A pre-charge circuit formed from p-type MOS transistors JP101 to JP103 is connected to one end side of the lines BL and /BL. In the read and write modes, the bit lines BL and /BL are pre-charged up to the power supply level in response to a bit line pre-charge signal /φB. On the other hand, in the standby mode, the bit lines BL and /BL are fixed to a state wherein they are pre-charged to the power supply level. A column switch is connected to the opposite end side of the bit lines BL and /BL and formed from p-type MOS transistors JP106 and JP107, n-type MOS transistor JN106 and JN107, and an inverter J101.

The p-type MOS transistor JP106 and the n-type OS transistor JN106 have current paths connected in parallel between the bit line BL and the data line DB, and the p-type MOS transistor JP107 and the n-type NOS transistor JN107 have current paths connected in parallel between the bit line /BL and the data line /DB. A column address signal Yn is applied to the gates of the n-type MOS transistors JN106 and JN107. Further, the column address signal Yn is inverted by an inverter JV01 and applied to the gates of the p-type MOS transistors JP106 and JP107. Consequently, when the column address signal Yn has the H level, the p-type MOS transistors JP106 and JP107 and the n-type MOS transistors JN106 and JN107 exhibit an on state, and the pair of bit lines BL and /BL and the pair of the data lines DB and /DB are electrically connected to each other, respectively.

Referring now to FIG. 3, p-type MOS transistors JP108, JP109 and JP110 form a pre-charge circuit for pre-charging the data lines DB and /DB, and pre-charge, in the read and write modes, the data lines DB and /DB to the power supply level in response to a pre-charge signal /φD. A pair of n-type MOS transistors JN111 and JN112 for data writing are connected between the data lines DB and /DB and the ground, respectively. In the write mode, one of the data lines DB and /DB is driven to the L level in response to data signals WD and /WD. The drains of the n-type MOS transistors JN111 and JN112 have a band to band leak preventing countermeasure applied thereto.

The data lines DB and /DB are connected to data lines DS and /DS through p-type MOS transistors JP111 and JP112, respectively. A data amplifier is connected to the data lines DS and /DS. The data amplifier includes a flip-flop formed from p-type MOS transistors JP113 and JP114 and n-type MOS transistors JN108 and JN109, and an n-type MOS transistor JN110 for applying the ground level to the flip-flop. A sense amplifier activation signal SE1 is applied to the gate of the n-type MOS transistor JN110 which is a component of the data amplifier. Another sense amplifier activation signal /SE2 is applied to gates of the p-type MOS transistors JP111 and JP112 described above. In the read mode, the p-type MOS transistors JP111 and JP112 are first placed into an on state in response to the sense amplifier activation signal /SE2, and as a result, data signals on the data lines DB and /DB are applied to the data amplifier. Then, the n-type MOS transistor JN110 is placed into an on state in response to the sense amplifier activation signal SE1, and as a result, amplification of the data signals is performed by the data amplifier.

Operation of the circuit system shown in FIGS. 2 and 3 is described taking operation of the standby mode as an example.

In the standby mode, the pre-charge signal /φB in FIG. 2 is fixed to the L level, and the bit lines BL and /BL are fixed to a state wherein they are pre-charged to the power supply level by the p-type MOS transistors JP101 to JP103 Further, the word line WL is fixed to the L level, and the n-type MOS transistors JN101 and JN102 for data transfer of the memory cell exhibit an off state, and the memory cell exhibits a non-selection state. Further, the column address signal Yn is fixed to the L level, and the p-type MOS transistors JP106 and JP107 and the n-type MOS transistors JN106 and JN107 exhibit an off state.

Further, referring to FIG. 3, in the standby mode, the pre-charge signal /φD for pre-charging the data lines is fixed to the L level, and the data lines DB and /DB are fixed to a state wherein they are pre-charged to the power supply level. Further, the write data WD and /WD are fixed to the L level, and the n-type MOS transistors JN111 and JN112 which are used for writing data are fixed to an off state. Further, the sense amplifier activation signal /SE2 is fixed to the L level, and the p-type MOS transistors JP111 and JP112 for transmitting the data signals to the data amplifier are fixed to an off state. The sense amplifier activation signal SE1 is fixed to the L level, and the n-type MOS transistor JN110 which forms the data amplifier exhibits an off-state.

In the following, the biased states at several portions when the state of the circuit is fixed as described above are examined and the possibility of occurrence of band to band leak and the necessity for a band to band leak preventing countermeasure are described.

(1) Bit Line Pre-charge Circuit (Refer to FIG. 2)

Since the pre-charge signal /φB is fixed to the L level (ground potential), the p-type MOS transistors JP101 and JP102 which form the bit line pre-charge circuit exhibit an on state, and the drains thereof connected to the bit lines BL and /BL exhibit the power supply potential. Accordingly, the p-type MOS transistors JP101 and JP102 are not placed in a biased state wherein band to band leak can occur. Consequently, there is no necessity to apply a band to band leak preventing countermeasure to the p-type MOS transistors JP101 and JP102.

(2) Memory Cell (Refer to FIG. 2)

The gate of each of the n-type MOS transistors JN101 and JN102 for data transfer which form the memory cell is connected to the word line WL fixed to the L level (ground potential), and one of the source and the drain is fixed to the power supply potential through a bit line. Besides, the other of the source and the drain of each of the n-type MOS transistors JN101 and JN102 is connected to an internal node of the memory cell and is fixed to the power supply potential through the p-type MOS transistor JP104 or JP105. Accordingly, it is necessary for the sources and the drains of the n-type MOS transistors JN101 and JN102 for data transfer to have a band to band leak preventing countermeasure applied thereto. After all, as regards the memory cell, all transistors which form it must have a band to band leak preventing countermeasure applied thereto.

(3) Column Switch (Refer to FIG. 2)

In the standby mode, since the data lines DB and /DB are pre-charged to the power supply potential by the p-type MOS transistors JP108 and JP109 shown in FIG. 3, respectively, the source and drain electrodes of the p-type MOS transistors JP106 and JP107 which form the column switch are fixed to a state wherein they are pre-charged to the power supply potential, and also the gates of them are fixed to the power supply potential Accordingly, it is not necessary for the p-type MOS transistor JP106 and JP107 to have a band to band leak preventing countermeasure applied thereto.

Further, the source and drain electrodes of the n-type MOS transistors JN106 and JN107 which form the column switch are fixed to the power supply potential, and the gates of them are fixed to the ground potential. Accordingly, the n-type MOS transistors JN106 and JN107 are fixed to a biased state wherein band to band leak can occur with both of the source and drain electrodes thereof, and as a result, they must have a band to band leak preventing countermeasure applied thereto.

(4) Data Line Pre-charge Circuit (Refer to FIG. 3)

In the standby mode, all of the p-type MOS transistors JP108 and JP109 which form the data line pre-charge circuit exhibit an on state. Therefore, the transistors need not have a band to band leak preventing countermeasure applied thereto.

(5) N-type MOS Transistors for Data Writing (Refer to FIG. 3)

In the write mode, the n-type MOS transistors JN111 and JN112 for data writing drive either one of the pair of data line DB and /DB to the L level in accordance with data. In the standby mode, the n-type MOS transistors JN111 and JN112 exhibit an off state, and the power supply potential is applied to the drains of them. Therefore, the transistors are fixed to a biased state in which band to band leak can occur. Accordingly, it is necessary for the n-type MOS transistors JN111 and JN112 to have a band to band leak preventing countermeasure applied thereto.

(6) Transistors for Data Transfer (Refer to FIG. 3)

In the standby mode, the p-type MOS transistors JP111 and JP112 for transferring data to the data amplifier are fixed to an off state. Accordingly, whether or not a band to band leak preventing counter measure is required depends upon whether or not the potential of that one of the two electrodes of the source and the drain of each of the p-type MOS transistors JP111 and JP112 which is connected to the data amplifier side is sometimes fixed to the L level. In particular, where the data amplifier is fixed to a latching state and one of the data lines DS and /DS is driven to the L level, the p-type MOS transistors JP111 and JP112 are placed into a biased state in which band to band leak current can appear. Accordingly, in the case just described, it is necessary for the p-type MOS transistors JP111 and JP112 to have a band to band leak preventing countermeasure applied thereto. Further, where the data amplifier is fixed to an unlatching state, since any of the data lines DS and /DS is not driven to the L level by the data amplifier, a band to band leak preventing countermeasure is not required.

(7) Data Amplifier (Refer to FIG. 3)

As regards the data amplifier, whether or not a band to band leak preventing countermeasure is required depends upon whether or not it is placed into a latching state in the standby mode.

First, it is assumed that, in the standby mode, the sense amplifier activation signal SE1 is fixed to the L level and the sense amplifier is fixed to a non-latching state. In this instance, if both of the data lines DS and /DS have the H level, then the drain of the n-type MOS field effect transistor JN110 is charged through the n-type MOS field effect transistors JN108 and JN109 and exhibits a raised potential. As a result, all of the p-type MOS field effect transistors JP113 and JP114 and the n-type MOS field effect transistors JN108 and JN109 is brought out of a biased state wherein band to band leak can occur. Also in the n-type MOS field effect transistor JN110, the potential applied to the drain thereof is a voltage lower by the gate threshold voltage of the n-type MOS field effect transistors JN108 and JN109 than the potential at the data lines DS and /DS. Therefore, the n-type MOS field effect transistor JN110 is brought out of a biased state wherein band to band leak can occur. According, in this instance, no band to band leak preventing countermeasure need be applied to any of the p-type MOS field effect transistors JP113 and JP114 and the n-type MOS field effect transistors JN108, JN109 and JN110 which form the sense amplifier.

On the other hand, when the sense amplifier activation signal SE1 is fixed to the H level and the sense amplifier is. fixed to a latching state in the standby mode, one of the data lines DS and /DS is driven to the L level in response to data, and either the combination of the p-type MOS field effect transistor JP113 and the n-type MOS field effect transistor JN109 or the combination of the p-type MOS field effect transistor JP114 and the n-type MOS field effect transistor JN108 is placed in a biased state wherein band to band leak can occur. Accordingly, a band to band leak preventing countermeasure need be applied the p-type MOS field effect transistors JP113 and JP114 and the n-type MOS field effect transistors JN108 and JN109.

Second Working Example

Now, a second working example of the first embodiment of the present invention is described.

Figure 4A:
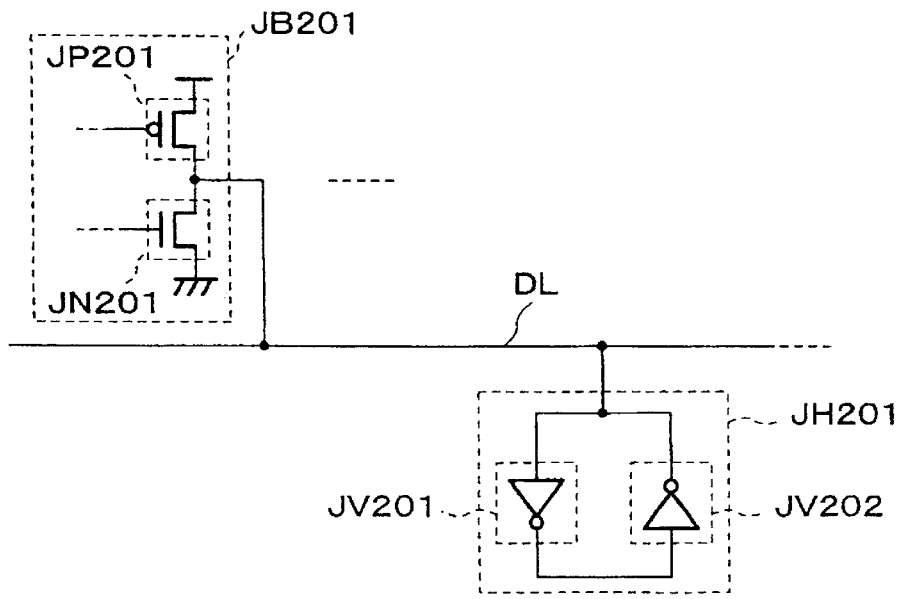
FIGS. 4A and 4B are circuit diagrams showing circuits according to a second working example of the first embodiment of the present invention.
Figure 4B:
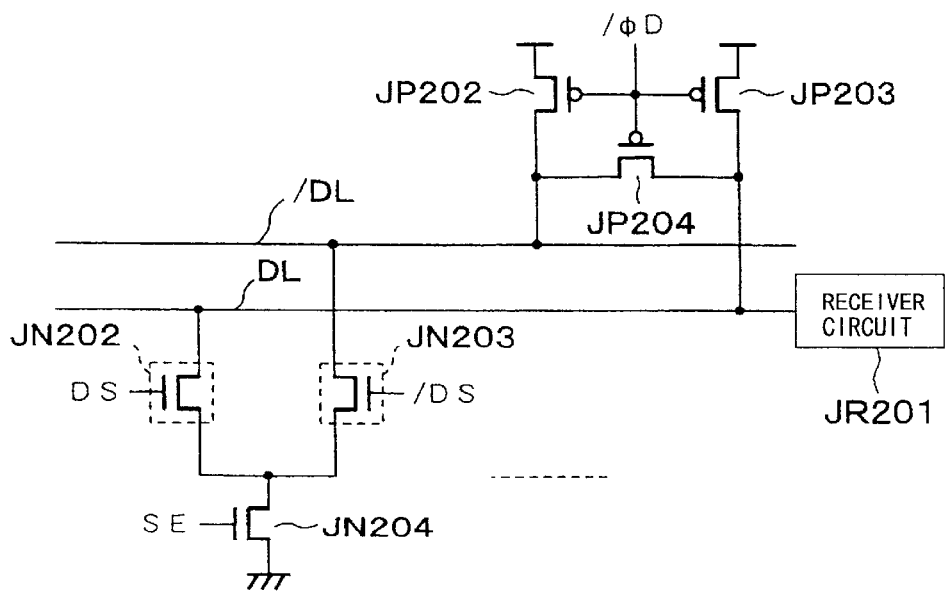

Circuit systems according to the second working example are shown in FIGS. 4A and 4B.

Referring first to FIG. 4A, the circuit shown is used to drive a data line DL with a buffer JB201 of the tri-state type. The buffer JB201 includes a p-type MOS transistor JP201 for outputting the H level and an n-type MOS transistor JN201 for outputting the L level. A plurality of buffers having a function similar to that of the buffer JB201 are connected to the data line DL such that they commonly share the data line DL. The buffers including the p-type MOS transistor JP201 shown have an output state which is controlled to a high impedance state in the standby mode. A bus holder JH201 for keeping the potential of the data line DL when the output states of the buffers are controlled to a high impedance state is connected to the data line DL. The bus holder JE201 is formed from a flip-flop including an inverter JV201 and another inverter JV202 cross-connected to each other.

Now, operation of the circuit system in the standby mode is described.

In the standby mode, the gate voltages of the p-type MOS transistor JP201 and the n-type MOS transistor JN201 which form the buffer JB201 are controlled to the H level (power supply potential) and the L level (ground potential), respectively. Consequently, both of the transistors JP201 and JN201 are fixed to an off state. Meanwhile, the bus holder JH201 holds a signal appearing on the data line DL till then.

When the H level (power supply potential) is held on the data line DL by the bus holder JH201, the n-type MOS transistor JN201 which forms the buffer JB201 is in a biased state wherein band to band leak can occur. On the other hand, when the L level (ground potential) is held on the data line DL, the p-type MOS transistor JP201 which forms the buffer JB201 is in a biased state wherein band to band leak can occur.

Accordingly, a band to band leak preventing countermeasure need be applied to both of the p-type MOS transistor JP201 and the n-type MOS transistor JN201 which form the buffer JB201. Further, one of the p-type MOS transistor and the n-type MOS transistor which form each of the inverters JV201 and JV202 of the bus holder JH201 is placed in an off state and consequently in a biased state wherein band to band leak can occur. Therefore, a band to band leak preventing countermeasure need be applied both of the inverters JV201 and JV202.

The circuit shown in FIG. 4B is a circuit system of a differential read bus which drives, in the read mode, one of the pair of data lines DL and /DL in response to a data signal and outputs the data signal. The drains of n-type MOS transistors JN202 and JN203 are connected to the data lines DL and /DL, respectively, and the sources of them are connected to the ground through an n-type MOS transistor JN204. A pair of data lines DS and /DS on which a data signal read out from a memory cell and amplified appear are connected to the gates of the n-type MOS transistors JN202 and JN203, respectively. A sense amplifier activation signal SE is applied to the gate of the n-type MOS transistor JN204. A pre-charge circuit composed of p-type MOS transistors JP202, JP203 and JP204 is connected to the data lines DL and /DL and pre-charges the data lines DL and /DL to the power supply level in response to a pre-charge signal /φD Now, operation of the circuit system is described.

In the standby mode, the n-type MOS transistors JN202 and JN203 are controlled to an off state, and the data lines DL and /DL are fixed to a state wherein they are pre-charged to the power supply potential. Accordingly, the n-type MOS transistors JN202 and JN203 are placed in a biased state wherein band to band leak can occur, and therefore, a band to band leak preventing countermeasure need be applied to the drains of the n-type MOS transistors JN202 and JN203. Further, since the p-type MOS transistors JP202 to JP204 are placed in an on state, they are not in a biased state wherein band to band leak can occur, and therefore, no band to band leak preventing countermeasure need be applied to them.

It is to be noted that, where the circuit systems described above with reference to FIGS. 4A and 4B are configured such that the data lines DL and /DL are not driven to the ground potential or such that the data lines DL and /DL are pre-charged but only to a potential lower, for example, by a gate threshold voltage of an n-type MOS field effect transistor than the power supply potential, the transistors are not placed into a biased state wherein band to band leak current can appear, and therefore, no band to band leak preventing countermeasure need be applied.

Third Working Example

In the following, a third working example of the first embodiment of the present invention is described.

Latch circuits according to the third working example are shown in FIGS. 5A, 5B, 6A and 6B.

Figure 5A:
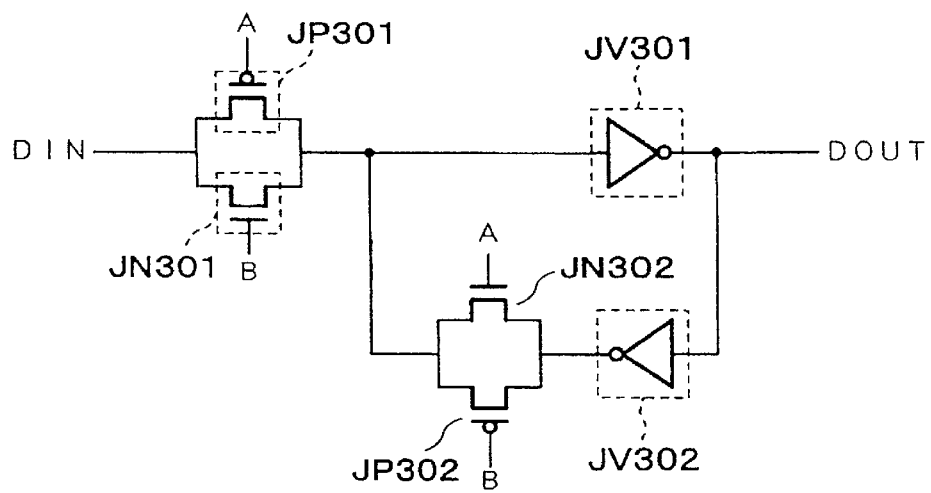
FIGS. 5A, 5B, 6A and 6B are circuit diagrams showing latch circuits employing a tri-state inverter according to a third working example of the first embodiment of the present invention.

Referring first to FIG. 5A, the latch circuit shown includes a transfer gate formed from a p-type MOS transistor JP301 and an n-type MOS transistor JN301, a pair of inverters JV301 and JV302, and another transfer gate formed from a p-type MOS transistor JP302 and an n-type MOS transistor JN302. The latch circuit is fixed to a latching state in the standby mode.

In the latch circuit shown in FIG. 5A, the p-type MOS transistor JP301, the n-type MOS transistor JN301 and the transistors which form the inverters JV301 and JV302 have a band to band leak preventing countermeasure applied thereto.

The transfer gate composed of the p-type MOS transistor JP301 and the n-type MOS transistor JN301 fetches an input signal DIN. The inverters JV301 and JV302 form a flip-flop for holding the fetched data. The transfer gate composed of the p-type MOS transistor JP302 and the n-type MOS transistor JN302 exhibits, in the standby mode, an on state in which it electrically connects an output terminal of the inverter JV302 and an input terminal of the inverter JV301 to each other so as to allow the inverters JV301 and JV302 to act as a flip-flop.

Now, operation of the latch circuit is described.

In the standby mode, a signal A and another signal B exhibit the H level and the L level, respectively. As a result, the p-type MOS transistor JP301 and the n-type MOS transistor JN301 are controlled to an off state and the p-type MOS transistor JP302 and the n-type MOS transistor JN302 are controlled to an on state. In this instance, the power supply potential or the ground potential is applied to one of the two source and drain electrodes of each of the p-type MOS transistor JP301 and the n-type MOS transistor JN301 which are in an off state in accordance with contents of data latched in the inverter JV301 and the inverter JV302.

Accordingly, the p-type MOS transistor JP301 and the n-type MOS transistor JN301 are controlled to a biased state wherein band to band leak can occur, and therefore, a band to band leak preventing countermeasure need be applied to them. Meanwhile, the inverters JV301 and JV302 which form a flip-flip are controlled to a biased state wherein band to band leak can occur similarly to the bus holder JH201 described hereinabove, and therefore, also the transistors which form the inverters JV301 and JV302 require application of a band to band leak preventing countermeasure thereto. The p-type MOS transistor JP302 and the n-type MOS transistor JN302 are controlled to an on state and are not in a biased state wherein band to band leak can occur, and therefore do not require application of a band to band leak preventing countermeasure thereto.

Figure 6A:
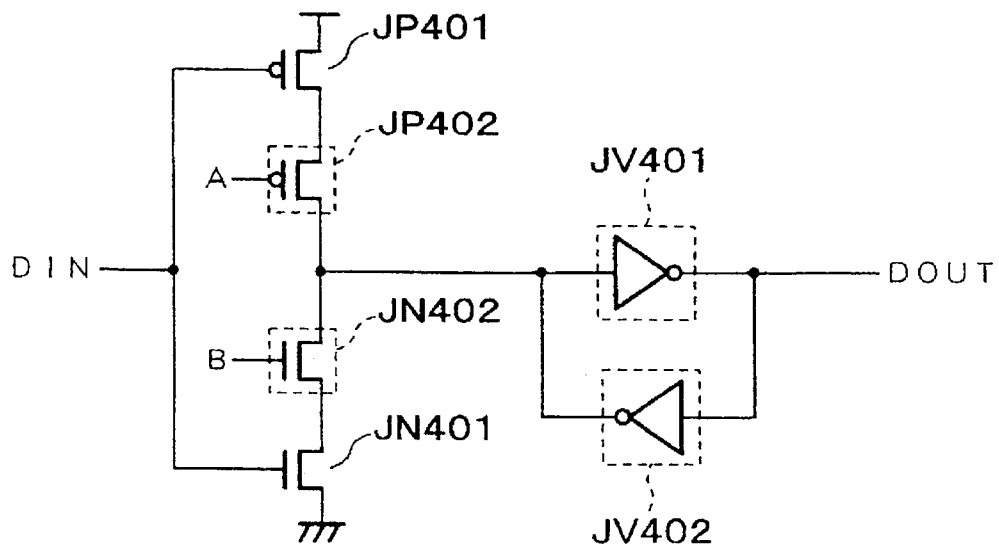
Figure 6B:
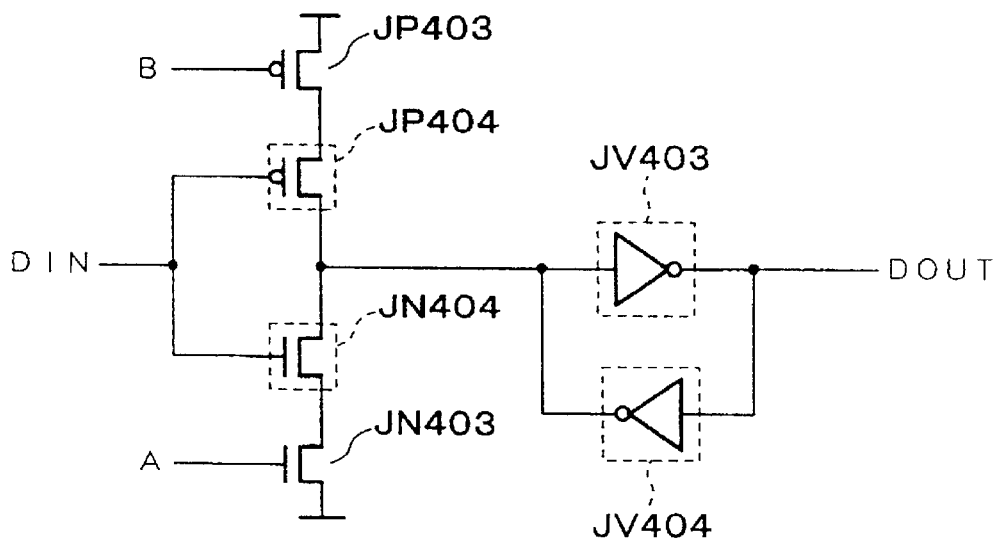

Now, the latch circuit shown in FIG. 6B is described.

Figure 5B:
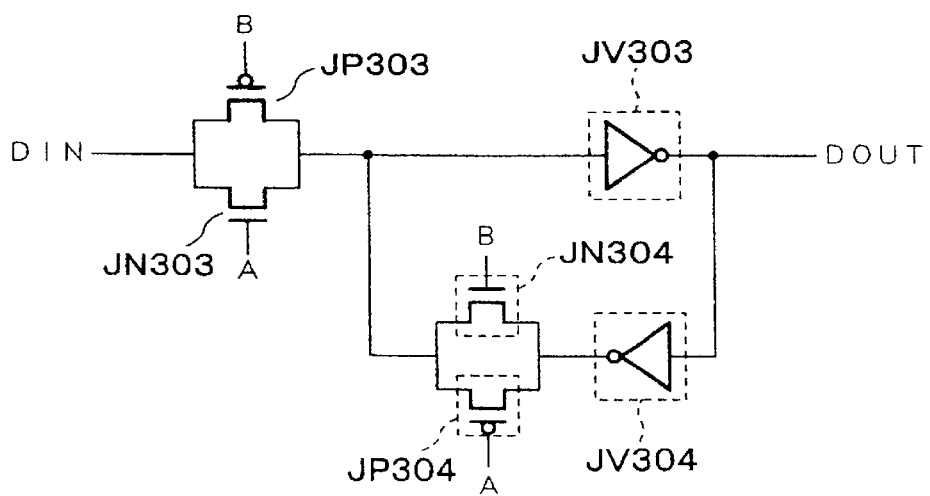

The latch circuit shown in FIG. 5B includes a transfer gate formed from a p-type MOS transistor JP303 and an n-type MOS transistor JN303, a pair of inverters JV303 and JV304, and another transfer gate formed from a p-type MOS transistor JP304 and an n-type MOS transistor JN304. The latch circuit is fixed to a through state in the standby mode.

The p-type MOS transistors JP303 and JP304, the n-type MOS transistors JN303 and JN304 and the inverters JV303 and JV304 correspond to the p-type MOS transistors JP301 and JP302, the n-type MOS transistors JN301 and JN302 and the inverters JV301 and JV302 described herein above with reference to FIG. 5A, respectively.

In the latch circuit shown in FIG. 5B, the p-type MOS transistor JP304, the n-type MOS transistor JN304 and the transistors which form the inverters JV303 and JV304 have a band to band leak preventing countermeasure applied thereto.

Now, operation of the latch circuit is described.

In the standby mode, a signal A and another signal B exhibit the H level and the L level, respectively. As a result, the p-type MOS transistor JP303 and the n-type MOS transistor JN303 are controlled to an on state and the p-type MOS field effect transistor JP304 and the n-type MOS transistor JN304 are controlled to an off state. In this instance, the power supply potential or the ground potential is applied to one of the two source and drain electrodes of each of the p-type MOS transistor JP304 and the n-type MOS transistor JN304 in an off state, which are connected to the output of the inverter JV304, in accordance with the signal level applied to the input of the inverter JV303 through the n-type MOS transistor JN303.

Accordingly, the p-type MOS transistor JP304 and the n-type MOS transistor JN304 are controlled to a biased state wherein band to band leak can occur, and therefore, a band to band leak preventing countermeasure need be applied to them. Meanwhile, the inverters JV303 and JV304 which form a flip-flop are controlled to a biased state wherein band to band leak can occur similarly to the inverters JV301 and JV302 described hereinabove, and therefore, also the transistors which form the inverters JV303 and JV304 require application of a band to band leak preventing countermeasure thereto. The p-type MOS transistor JP303 and the n-type MOS transistor JN303 are controlled to an on state and are not in a biased state wherein band to band leak can occur, and therefore, do not require application of a band to band leak preventing countermeasure thereto.

Now, the latch circuit shown in FIG. 6A is described.

The latch circuit shown includes an inverter of the tri-state type formed from a pair of p-type MOS transistors JP401 and JP402 and a pair of n-type MOS transistors JN401 and JN402, and a flip-flop formed from a pair of inverters JV401 and JV402. The latch circuit is fixed to a latching state in the standby mode.

In the latch circuit shown in FIG. 6A, the p-type MOS transistor JP402, the n-type MOS transistor JN402 and the transistors which form the inverters JV401 and JV402 have a band to band leak preventing countermeasure applied thereto.

The source of the p-type MOS transistor JP401 is connected to the power supply, and the source of the p-type MOS transistor JP402 is connected to the drain of the p-type MOS transistor JP401. The source of the n-type MOS transistor JN401 is connected to the ground, and the source of the n-type MOS transistor JN402 is connected to the drain of the n-type MOS transistor JN401. The drain of the n-type MOS transistor JN402 is connected to the drain of the p-type MOS transistor JP402 and serves as an output portion of the inverter of the tri-state type. An input signal DIN is applied to the gates of the p-type MOS transistor JP401 and the n-type MOS transistor JN401, and a signal A which exhibits the H level in the standby mode is applied to the gate of the p-type MOS field effect transistor JP402 while another signal B which exhibits the L level in the standby mode is applied to the gate of the n-type MOS field effect transistor JN402.

Now, operation of the latch circuit is described.

In the standby mode, the signal A and the signal B exhibit the H level and the L level, respectively. As a result, the p-type MOS transistor JP402 and the n-type MOS transistor JN402 are controlled to an off state. In this instance, the power supply potential or the ground potential is applied to one of the two source and drain electrodes of each of the p-type MOS transistor JP402 and the n-type MOS transistor JN402 which are in an off state in accordance with contents of data latched in the inverter JV401 and the inverter JV402.

Accordingly, the p-type MOS transistor JP402 and the n-type MOS transistor JN402 are in a biased state wherein band to band leak can occur, and therefore, a band to band leak preventing counter measure need be applied to them. Meanwhile, the inverters JV401 and JV402 which form a flip-flip are in a biased state wherein band to band leak can occur similarly to the inverters JV301 and JV302 described hereinabove, and therefore, also the transistors which form the inverters JV401 and JV402 require application of a band to band leak preventing countermeasure thereto.

Now, the latch circuit shown in FIG. 6B is described.

The latch circuit shown includes an inverter of the tri-state type formed from a pair of p-type MOS transistors JP403 and JP404 and a pair of n-type MOS transistors JN403 and JN404, and a flip-flop formed from a pair of inverters JV403 and JV404. The latch circuit is fixed to a through state in the standby mode.

In the latch circuit shown in FIG. 6B, the p-type MOS transistor JP404, the n-type MOS transistor JN404 and the transistors which form the inverters JV403 and JV404 have a band to band leak preventing countermeasure applied thereto.

The latch circuit shown in FIG. 6B corresponds to the latch circuit described hereinabove with reference to FIG. 6A wherein the positions of the transistors which receive the input signal DIN at the gate thereof and the transistors whose conducting state is controlled in the standby mode are exchanged for each other.

In particular, the source of the p-type MOS transistor JP403 is connected to the power supply, and the source of the p-type MOS transistor JP404 is connected to the drain of the p-type MOS transistor JP403. The source of the n-type MOS transistor JN403 is connected to the ground, and the source of the n-type MOS transistor JN404 is connected to the drain of the n-type MOS transistor JN403. The drain of the n-type MOS transistor JN404 is connected to the drain of the p-type MOS transistor JP404 and serves as an output portion of the inverter of the tri-state type. The input signal DIN is applied to the gates of the p-type MOS transistor JP404 and the n-type MOS transistor JN404, and a signal B which exhibits the L level in the standby mode is applied to the gate of the p-type MOS transistor JP403 while another signal A which exhibits the H level in the standby mode is applied to the gate of the n-type MOS transistor JN403.

Now, operation of the latch circuit is described.

In the standby mode, the signal A and the signal B exhibit the H level and the L level, respectively. As a result, the p-type MOS transistor JP403 and the n-type MOS transistor JN403 are controlled to an off state. In this instance, one of the p-type MOS transistor JP404 and the n-type MOS transistor JN404 sometimes exhibits an off state in accordance with the input signal DIN, and the power supply potential or the ground potential is applied to one of the two source and drain electrodes of each of the p-type MOS transistor JP404 and the n-type MOS transistor JN404 in accordance with contents of data latched in the inverter JV403 and the inverter JV404.

Accordingly, the p-type MOS transistor JP404 and the n-type MOS transistor JN404 are in a biased state wherein band to band leak can occur, and therefore, a band to band leak preventing countermeasure need be applied to them. Meanwhile, the inverters JV403 and JV404 which form a flip-flip are in a biased state wherein band to band leak can occur similarly to the inverters JV301 and JV302 described hereinabove, and therefore, also the transistors which form the inverters JV403 and JV404 require application of a band to band leak preventing countermeasure thereto.

Fourth Working Example

In the following, a fourth working example of the first embodiment of the present invention is described.

Figure 7:
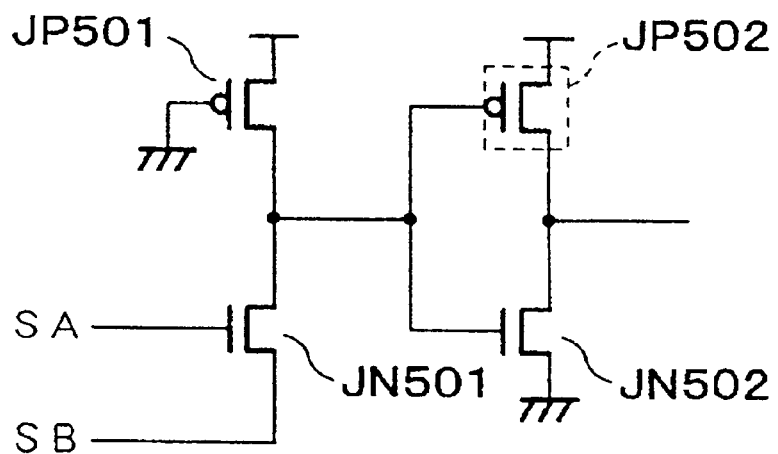
FIG. 7 is a circuit diagram showing a source drive logic circuit according to a fourth working example of the first embodiment of the present invention.

FIG. 7 shows a source drive logic circuit according to the fourth working example.

Referring to FIG. 7, the logic circuit shown includes a first stage gate circuit formed from a p-type MOS transistor JP501 and an n-type MOS transistor JN501, and an inverter formed from a p-type MOS transistor JP502 and an n-type MOS transistor JN502 and outputs an output signal which is fixed to the L level in the standby mode. In the logic circuit shown in FIG. 7, the p-type MOS transistor JP502 has a band to band leak preventing countermeasure applied thereto. However, depending upon the combination of logic levels of input signals SA and SB, a band to band leak preventing countermeasure need be applied also to the n-type MOS transistor JN501.

The p-type MOS transistor JP501 functions as a load to the n-type MOS transistor JN501. The source of the p-type MOS transistor JP501 is connected to the power supply, and the gate of the p-type MOS transistor JP501 is connected to the ground. The n-type MOS transistor JN501 receives the signal SA at the gate thereof and receives the signal SB at the source thereof. The first stage gate circuit outputs the L level only when the signal SA has the H level and the signal SB has the L level. The inverter in the next stage inverts the output of the first stage gate circuit.

Now, operation of the source drive logic circuit is described.

In the standby mode, the logic circuit is fixed to a state wherein it outputs the L level. Accordingly, the p-type MOS transistor JP502 which forms the inverter in the following stage is placed in a biased state wherein band to bank leak can occur and therefore requires application of a band to band leak preventing countermeasure thereto.

In order to fix the output signal of the logic circuit to the L level in the standby mode, three different combinations of the logic levels of the signals SA and SB are available. The first combination is a combination of the L level of the signal SA and the H level of the signal SB; the second combination is a combination of the H level of the signal SA and the H level of the signal SB; and the third combination is a combination of the L level of the signal SA and the L level of the signal SB. Of the three combinations, the first and third combinations involve a biased state wherein band to band leak can occur. Accordingly, where the signals SA and SB assume the logic levels of the first or third combination in the standby mode, a band to band leak preventing countermeasure need be applied also to the n-type MOS transistor JN501.

Fifth Working Example

Figure 8:
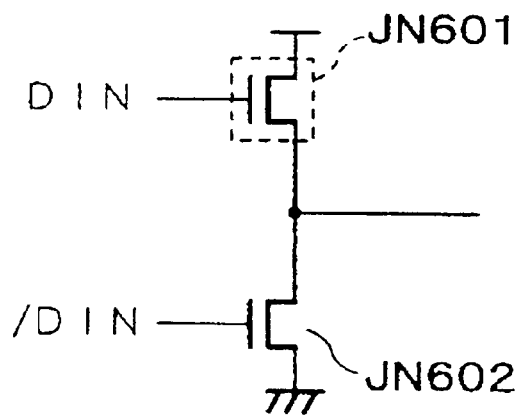
FIG. 8 is a circuit diagram showing a low amplitude logic signal driver circuit according to a fifth working example of the first embodiment of the present invention.

FIG. 8 shows a low amplitude logic signal driver circuit (hereinafter referred to as "low amplitude driver circuit") according to a fifth working example of the first embodiment of the present invention.

Referring to FIG. 8, the low amplitude driver circuit shown includes an n-type MOS transistor JN601 and another n-type MOS transistor JN602 which have the same conduction type and outputs an output signal which is fixed to the L level in the standby mode. In the low amplitude driver circuit, the n-type MOS transistor JN601 has a band to band leak preventing countermeasure applied thereto.

Now, operation of the low amplitude driver circuit is described.

In the standby mode, an input signal DIN has the L level and another input signal /DIN has the H level. As a result, the n-type MOS transistor JN601 is in a biased state wherein band to band leak can occur. On the other hand, since the n-type MOS transistor JN602 is in an on state, it is not in a biased state wherein band to band leak can occur. Accordingly, only the n-type MOS field effect transistor JN601 requires application of a band to band leak preventing countermeasure thereto.

However, where the input signal DIN has the H level and the output signal is fixed to the H level in the standby mode, since the n-type MOS transistor JN601 is not in a biased state wherein band to band leak current can appear, it does not require application of a band to band leak preventing countermeasure thereto.

Sixth Working Example

In the following, a sixth working example of the first embodiment of the present invention is described.

Figure 9A:
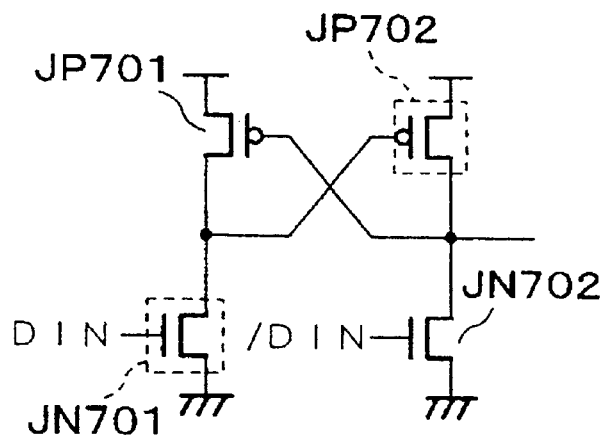
FIGS. 9A and 9B are circuit diagrams showing a level conversion circuit according to a sixth working example of the first embodiment of the present invention.
Figure 9B:
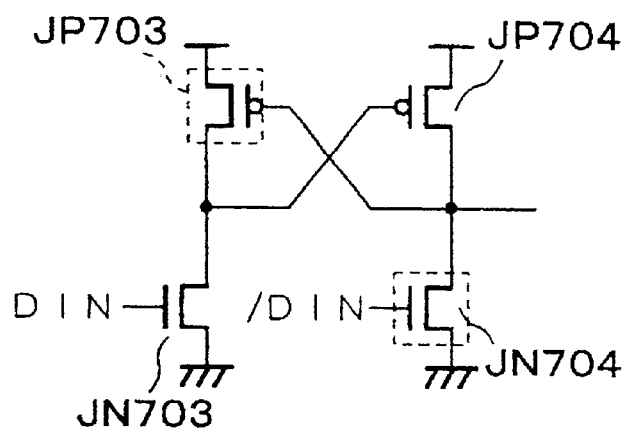

FIGS. 9A and 9B show level conversion circuits according to the sixth working example.

Referring first to FIG. 9A, the level conversion circuit shown includes a pair of p-type MOS transistors JP701 and JP702 and a pair of n-type MOS transistors JN701 and JN702 and outputs an output signal which is fixed to the L level in the standby mode. In the level conversion circuit, the p-type MOS transistor JP702 and the n-type MOS transistor JN701 have a band to band leak preventing countermeasure applied thereto.

Now, operation of the level conversion circuit is described.

In the standby mode, an input signal DIN has the L level and another input signal /DIN has the H level. In this instance, the n-type MOS transistor JN701 is controlled to an off state and the n-type MOS transistor JN702 is controlled to an on state. As a result, the p-type MOS transistor JP701 exhibits an on state, and the power supply potential is applied to the drain of the n-type MOS transistor JN701. Accordingly, in this instance, the n-type MOS transistor JN701 is in a biased state wherein band to band leak can occur. Meanwhile, since the n-type MOS transistor JN702 is in an on state and the L level appears at the drain of the n-type MOS transistor JN702, the n-type MOS transistor JN702 is not in a biased state wherein band to band leak can occur. Accordingly, in this instance, the p-type MOS transistor JP702 and the n-type MOS transistor JN701 require application of a band to band leak preventing countermeasure thereto.

Referring now to FIG. 9B, the level conversion circuit shown includes a pair of p-type MOS transistors JP703 and JP704 and a pair of n-type MOS transistors JN703 and JN704 and outputs an output signal which is fixed to the H level in the standby mode. In this instance, the signal DIN has the H level and the signal /DIN has the L level in the standby mode. Accordingly, conversely to the level conversion circuit described hereinabove with reference to FIG. 9A, a band to band leak preventing countermeasure need be applied to the n-type MOS field effect transistor JN704 and the p-type MOS transistor JP703 to which the signal /DIN is inputted.

Seventh Working Example

Figure 10:
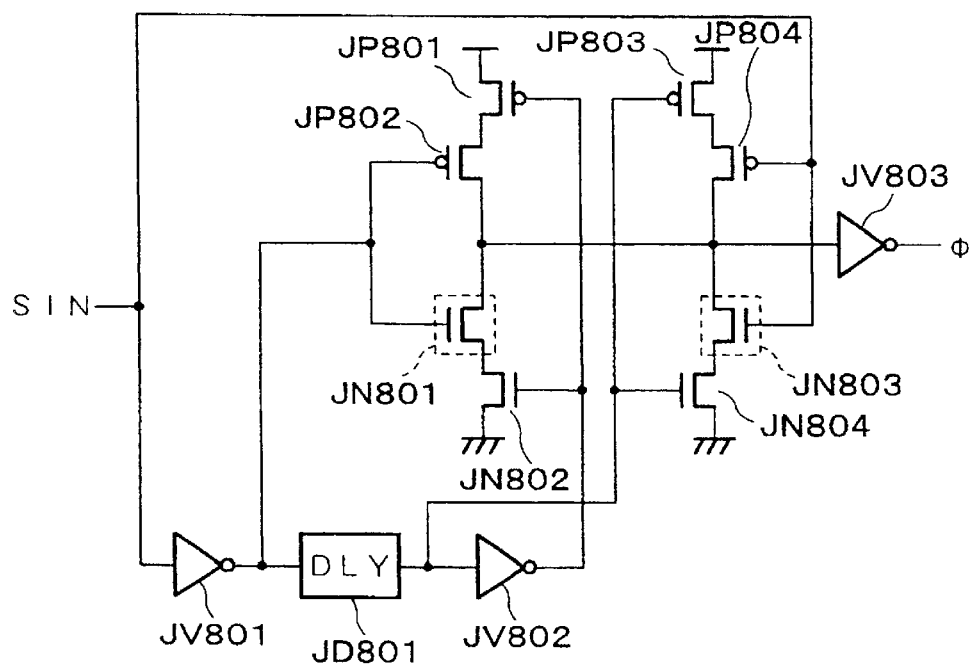
FIG. 10 is a circuit diagram showing an address transition detector circuit according to a seventh working example of the first embodiment of the present invention.

FIG. 10 shows an address transition detection (ATD) circuit according to a seventh working example of the first embodiment of the present invention.

The ATD circuit functions as a one-shot pulse generation circuit for generating a one-shot pulse φ and includes inverters JV801 to JV803, a delay circuit JD801, p-type MOS transistors 801 to JP804, and n-type MOS transistors JN801 to JN804. In the standby mode, an input signal SIN is fixed to a steady state, and the one-shot pulse signal φ is fixed to the L level.

When the input signal SIN to the ATD circuit is fixed to the L level, the n-type MOS field effect transistor JN803 is controlled to an off state and hence to a biased state wherein band to band leak can occur. On the other hand, if the input signal SIN is fixed to the H level, then the n-type MOS transistor JN801 is placed in an off state and hence in a biased state wherein band to band leak can occur. Accordingly, the n-type MOS transistors JN801 and JN803 require application of a band to band leak preventing countermeasure thereto.

<Second Embodiment>

In the following, a second embodiment of the present invention is described

Figure 11:
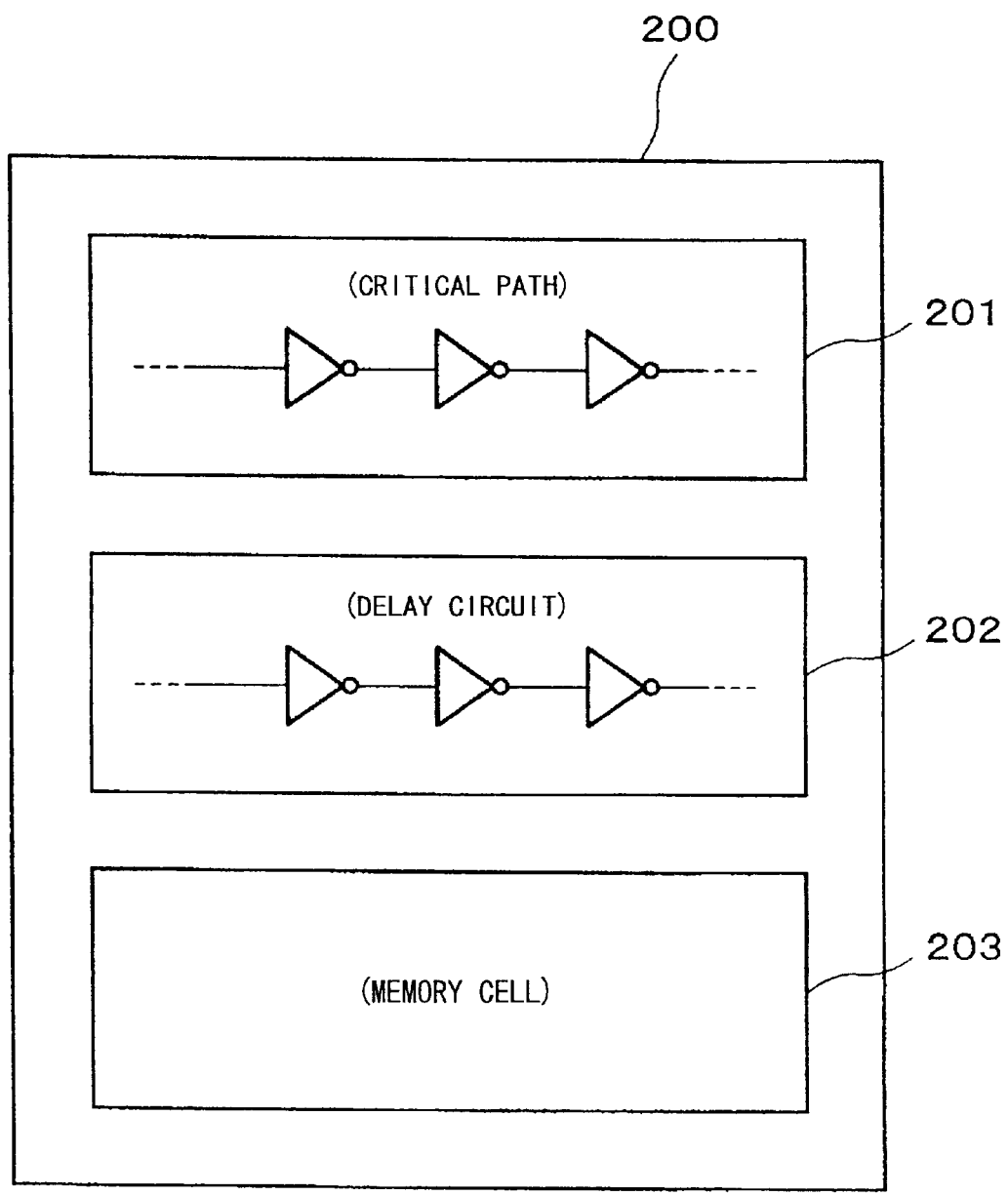
FIG. 11 is a diagrammatic view showing a general configuration of a semiconductor device according to a second embodiment of the present invention.

FIG. 11 shows a general configuration of a 200x according to the second embodiment.

Referring to FIG. 11, the semiconductor device 200 is formed from a circuit including a MOS transistor, and includes a critical path 201, a circuit system 202 such as, for example, a delay circuit other than the critical path 201, and a memory cell 203.

The critical path 201 is a circuit system for which a high operation speed is required, and the semiconductor device 200 includes, in the other circuit system thereof except the critical path 201, as a MOS transistor which is placed in an off state while a predetermined potential difference is exhibited between the gate and the drain thereof, a MOS transistor having a band to band leak preventing countermeasure applied thereto on the drain side thereof like, for example, the n-type MOS field effect transistor TN11 shown in FIG. 1.

Consequently, current consumption arising from band to band leak can be suppressed effectively without sacrificing the operation speed of the critical path 201.

It is to be noted that, if the MOS transistor having a band to band leak preventing countermeasure applied thereto is controlled to an off state in the standby mode, then the band to band leak current in the MOS transistor is suppressed, and consequently, standby current can be controlled effectively.

<Third Embodiment>

In the following, a third embodiment of the present invention is described.

Figure 12A:
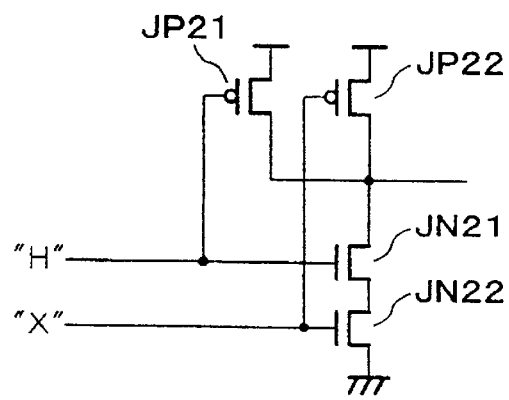
FIGS. 12A, 12B and 12C are diagrammatic views showing a configuration of a basic gate of a semiconductor device according to a third embodiment of the present invention.
Figure 12B:
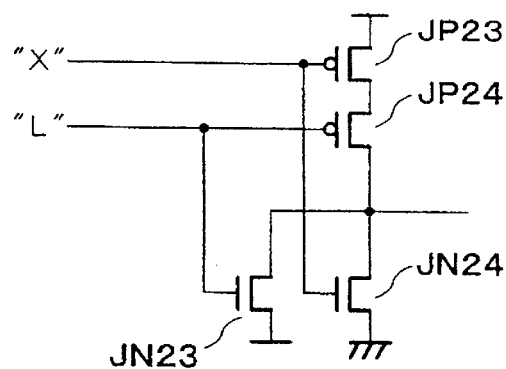
Figure 12C:
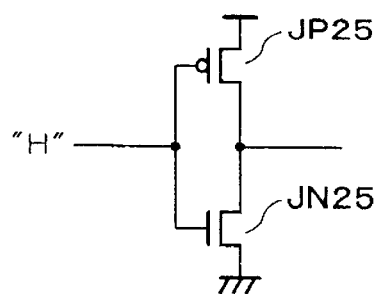

FIGS. 12A to 12C show different basic gate circuits included in a semiconductor circuit of the third embodiment. The basic gate circuits are different from the semiconductor device of the first embodiment described hereinabove with reference to FIG. 1 in that they do not have a band to band leak preventing countermeasure on device structure applied thereto and that a transistor to whose drain the H level is applied in a static operation state such as, for example, a standby mode is controlled to an on state. In particular, the basic gate circuits according to the present embodiment include, as a MOS transistor to whose drain a logic level with which band to band leak can occur in a dynamic operation state such as a write mode or a read mode is applied, a MOS transistor to whose gate a logic level same as the logic level described above is applied in a static operation state such as a standby mode.

It is to be noted that, where the MOS transistor is controlled to an off state in the standby mode, since band to band leak current in the MOS transistor is suppressed, current consumption in the standby mode which arises from band to band leak current can be suppressed effectively. Further, the "static operation state" is not limited to the standby mode, but includes any state wherein no substantial signal variation is involved in the write mode or the read mode.

In the following, the semiconductor device according to the third embodiment is described assuming that the static operation state is the standby mode.

The circuit shown in FIG. 12A is a NAND gate of the CMOS configuration for arithmetic NANDing operation. In the standby mode, the H level is applied to the gate of an n-type MOS transistor JN21 whose drain is connected to an output node of the circuit. Consequently, even if the H level is not applied to the drain of the n-type MOS transistor JN21, the n-type MOS transistor JN21 in the standby mode is not in a biased state wherein band to band leak can occur Meanwhile, a voltage lower by a gate threshold voltage Vth of the n-type MOS transistor JN21 than the power supply potential is applied to the drain of an n-type MOS transistor JN22, the n-type MOS transistor JN22 is not in a biased state wherein band to band leak can occur either. Accordingly, by controlling the input state of a signal in the standby mode in this manner, occurrence of band to band leak can be prevented without applying a countermeasure on a device.

The circuit shown in FIG. 12B is a NOR circuit of the CMOS configuration for arithmetic NORing operation. In the standby mode, the L level is applied to the gate of a p-type MOS transistor JP24 whose drain is connected to an output node of the circuit. Consequently, even if the L level is applied to the gate of the p-type MOS transistor JP24, the p-type MOS transistor JP24 in the standby mode is not in a biased state wherein band to band leak can occur. Meanwhile, a voltage higher by a gate threshold voltage Vth of the p-type MOS transistor JP24 than the ground potential is applied to the drain of a p-type MOS transistor JP23, the p-type MOS transistor JP23 is not in a biased state wherein band to band leak can occur either Accordingly, by controlling the input state of a signal in the standby mode in this manner, occurrence of band to band leak can be prevented without applying a countermeasure on a device.

The circuit shown in FIG. 12C is a basic gate (inverter of the CMOS configuration) for logical NOT operation. In the standby mode, the H level is applied to the gate of a p-type MOS transistor JP25 and an n-type MOS transistor JN25 and the output signal is fixed to the L level. The n-type MOS transistor JN25 whose drain is connected to an output node of the circuit exhibits an on state in the standby mode. Consequently, the n-type MOS transistor JN25 in the standby mode is not in a biased state wherein band to band leak can occur, and therefore, band to band leak can be prevented without applying a countermeasure on a device.

While preferred embodiments of the present invention have been described using specific terms, such description is for illustrative purposes only, and it is to be understood that changes and variations may be made without departing from the spirit or scope of the following claims.

For example, a band to band leak preventing countermeasure is sometimes required for both of the source and the drain like, for example, the n-type MOS field effect transistors JN101 and JN102 shown in FIG. 2 or is sometimes required for only one of the drain and the source like, for example, the n-type MOS field effect transistor JN104 shown in FIG. 2. Accordingly, it is advisable to examine whether or not band to band leak occurs with each of the source and the drain and apply a countermeasure to any of them to which it is determined to require application of a countermeasure irrespective of the embodiments described hereinabove.

Further, while the present invention suppresses current consumption of a semiconductor device arising from band to band leak current without depending upon an operation state, it can effectively suppress current consumption particularly in a standby mode in which very low current consumption is required.

What is claimed is:

1. A semiconductor device, comprising:
a circuit including a plurality of MOS (Metal Oxide Semiconductor) transistors, said MOS transistors including a MOS transistor which is controlled to an off state while a predetermined potential difference is provided between a gate and a drain thereof, said MOS transistor having a structure that includes a band to band leak preventing countermeasure applied to the drain thereof.

2. A semiconductor device, comprising:
a plurality of circuits each including a plurality of MOS (Metal Oxide Semiconductor) transistors, said MOS transistors including a MOS transistor which is controlled to an off state while a predetermined potential difference is provided between a gate and a drain thereof, said MOS transistor having a structure that includes a band to band leak preventing countermeasure applied to the drain thereof except any of said circuits for which a high operation speed is required.

3. A semiconductor device, comprising:
a circuit including a plurality of MOS transistors, said MOS transistors including a MOS transistor having a drain to which a logic level with which band to band leak can occur in a dynamic operation state is applied, said MOS transistor having a gate to which a logic level same as the logic level is applied in a static operation state.

4. A semiconductor device as claimed in claim 1, wherein said MOS transistor comprises an n-type MOS transistor which is a component of a basic gate circuit for logical NANDing operation, and the drain thereof is connected to an output node of said basic gate circuit.

5. A semiconductor device as claimed in claim 1, wherein said MOS transistor comprises a p-type MOS transistor which is a component of a basic gate circuit for logical NORing operation, and the drain thereof is connected to an output node of said basic gate circuit.

6. A semiconductor device as claimed in claim 1, wherein said MOS transistor comprises a component of a basic gate circuit for logical NOT operation.

7. A semiconductor device as claimed in claim 1, wherein said MOS transistor comprises a component of a static memory cell which includes a flip-flop as a principal component.

8. A semiconductor device as claimed in claim 1, wherein said MOS transistor comprises a component of a column switch for selecting a bit line pair.

9. A semiconductor device as claimed in claim 1, wherein said MOS transistor drives a bit line pair in a write mode.

10. A semiconductor device as claimed in claim 1, wherein said MOS transistor comprises a component of a sense amplifier which includes a flip-flop as a principal component.

11. A semiconductor device as claimed in claim 1, wherein said MOS transistor comprises a component of a bus holder for holding the level of a data bus.

12. A semiconductor device as claimed in claim 1, wherein said MOS transistor drives a pair of data buses for transmitting a data signal comprising complementary signals in a read mode.

13. A semiconductor device as claimed in claim 1, wherein said MOS transistor comprises a component of a flip-flop.

14. A semiconductor device as claimed in claim 1, wherein said MOS transistor comprises a component of a logic circuit which receives input signals at the source and the gate of said MOS transistor and performs predetermined logical operation of the input signals.

15. A semiconductor device as claimed in claim 1, wherein said MOS transistor is connected at the drain thereof to a power supply or the ground.

16. A semiconductor device as claimed in claim 1, wherein said MOS transistor comprises a component of a level conversion circuit for converting the signal level of an input signal.

17. A semiconductor device as claimed in claim 1, wherein said MOS transistor comprises a component of a pulse generation circuit for detecting a variation of an input signal to generate a one-shot pulse.

18. A semiconductor device as claimed in claim 2, wherein said MOS transistor comprises an n-type MOS transistor which is a component of a basic gate circuit for logical NANDing operation, and the drain thereof is connected to an output node of said basic gate circuit.

19. A semiconductor device as claimed in claim 3, wherein said MOS transistor comprises an n-type MOS transistor which is a component of a basic gate circuit for logical NANDing operation, and the drain thereof is connected to an output node of said basic gate circuit.

20. A semiconductor device as claimed in claim 2, wherein said MOS transistor comprises a p-type MOS transistor which is a component of a basic gate circuit for logical NORing operation, and the drain thereof is connected to an output node of said basic gate circuit.

21. A semiconductor device as claimed in claim 3, wherein said MOS transistor comprises a p-type MOS transistor which is a component of a basic gate circuit for logical NORing operation, and the drain thereof is connected to an output node of said basic gate circuit.

22. A semiconductor device as claimed in claim 2, wherein said MOS transistor comprises a component of a basic gate circuit for logical NOT operation.

23. A semiconductor device as claimed in claim 3, wherein said MOS transistor comprises a component of a basic gate circuit for logical NOT operation.

24. A semiconductor device as claimed in claim 2, wherein said MOS transistor comprises a component of a static memory cell which includes a flip-flop as a principal component.

25. A semiconductor device as claimed in claim 3, wherein said MOS transistor comprises a component of a static memory cell which includes a flip-flop as a principal component.

26. A semiconductor device as claimed in claim 2, wherein said MOS transistor comprises a component of a column switch for selecting a bit line pair.

27. A semiconductor device as claimed in claim 3, wherein said MOS transistor comprises a component of a column switch for selecting a bit line pair.

28. A semiconductor device as claimed in claim 2, wherein said MOS transistor drives a bit line pair in a write mode.

29. A semiconductor device as claimed in claim 3, wherein said MOS transistor drives a bit line pair in a write mode.

30. A semiconductor device as claimed in claim 2, wherein said MOS transistor comprises a component of a sense amplifier which includes a flip-flop as a principal component.

31. A semiconductor device as claimed in claim 3, wherein said MOS transistor comprises a component of a sense amplifier which includes a flip-flop as a principal component.

32. A semiconductor device as claimed in claim 2, wherein said MOS transistor comprises a component of a bus holder for holding the level of a data bus.

33. A semiconductor device as claimed in claim 3, wherein said MOS transistor comprises a component of a bus holder for holding the level of a data bus.

34. A semiconductor device as claimed in claim 2, wherein said MOS transistor drives a pair of data buses for transmitting a data signal comprising complementary signals in a read mode.

35. A semiconductor device as claimed in claim 3, wherein said MOS transistor drives a pair of data buses for transmitting a data signal comprising complementary signals in a read mode.

36. A semiconductor device as claimed in claim 2, wherein said MOS transistor comprises a component of a flip-flop.

37. A semiconductor device as claimed in claim 3, wherein said MOS transistor comprises a component of a flip-flop.

38. A semiconductor device as claimed in claim 2, wherein said MOS transistor comprises a component of a logic circuit which receives input signals at the source and the gate of said MOS transistor and performs predetermined logical operation of the input signals.

39. A semiconductor device as claimed in claim 3, wherein said MOS transistor comprises a component of a logic circuit which receives input signals at the source and the gate of said MOS transistor and performs predetermined logical operation of the input signals.

40. A semiconductor device as claimed in claim 2, wherein said MOS transistor comprises connected at the drain thereof to a power supply or the ground.

41. A semiconductor device as claimed in claim 3, wherein said MOS transistor comprises connected at the drain thereof to a power supply or the ground.

42. A semiconductor device as claimed in claim 2, wherein said MOS transistor comprises a component of a level conversion circuit for converting the signal level of an input signal.

43. A semiconductor device as claimed in claim 3, wherein said MOS transistor comprises a component of a level conversion circuit for converting the signal level of an input signal.

44. A semiconductor device as claimed in claim 2, wherein said MOS transistor comprises a component of a pulse generation circuit for detecting a variation of an input signal to generate a one-shot pulse.

45. A semiconductor device as claimed in claim 3, wherein said MOS transistor comprises a component of a pulse generation circuit for detecting a variation of an input signal to generate a one-shot pulse.

* * * * *